(12) United States Patent
Kim et al.

(10) Patent No.: US 9,362,220 B2
(45) Date of Patent: Jun. 7, 2016

(54) SEMICONDUCTOR DEVICE

(71) Applicant: SAMSUNG ELECTRONICS CO., LTD., Suwon-si, Gyeonggi-do (KR)

(72) Inventors: Sang-Jong Kim, Hwaseong-si (KR); Jae-Hyeon Park, Seoul (KR); Sung-Hoon Bae, Hwaseong-si (KR); Jong-Wan Ma, Suwon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/587,291

(22) Filed: Dec. 31, 2014

(65) Prior Publication Data
US 2015/0115457 A1 Apr. 30, 2015

Related U.S. Application Data

(62) Division of application No. 13/287,260, filed on Nov. 2, 2011, now Pat. No. 8,928,033.

(30) Foreign Application Priority Data

Nov. 15, 2010 (KR) .......................... 10-2010-0113352

(51) Int. Cl.
*H01L 23/60* (2006.01)
*H01L 23/50* (2006.01)
*H01L 27/02* (2006.01)
*H01L 21/8234* (2006.01)
*H01L 23/00* (2006.01)

(52) U.S. Cl.
CPC ................ *H01L 23/50* (2013.01); *H01L 23/60* (2013.01); *H01L 27/0292* (2013.01); *H01L 21/823475* (2013.01); *H01L 24/05* (2013.01); *H01L 2924/01019* (2013.01); *H01L 2924/01021* (2013.01)

(58) Field of Classification Search
CPC ................ H01L 23/60; H01L 27/0292; H01L 21/823475
See application file for complete search history.

(56) References Cited

U.S. PATENT DOCUMENTS 7,091,541 B2 8/2006 Natsume et al.

FOREIGN PATENT DOCUMENTS

| KR | 10-2001-0004034 A | 1/2001 |
|---|---|---|
| KR | 10-2002-049125 A | 6/2002 |
| KR | 10-2005-035687 A | 4/2005 |

*Primary Examiner* — Amar Movva
(74) *Attorney, Agent, or Firm* — Lee & Morse, P.C.

(57) ABSTRACT

A semiconductor device, including a substrate having an active region defined therein, a plurality of bit lines extending on the substrate in a first direction, a plurality of interconnection lines extending on the substrate in a second direction, a pad electrically connected to the plurality of interconnection lines and configured to apply an external voltage, a plurality of metal contacts electrically connecting the interconnection lines and the plurality of bit lines, and a plurality of bit line contacts that are in contact with the active region and electrically connect the plurality of bit lines and the active region, wherein a size of at least some of the bit line contacts and/or at least some of the metal contacts vary based on a distance of the respective bit line contact or the metal contact from the pad.

8 Claims, 7 Drawing Sheets

SEMICONDUCTOR DEVICE

CROSS REFERENCE TO RELATED APPLICATIONS

This is a divisional application based on pending application Ser. No. 13/287,260, filed Nov. 2, 2011, the entire contents of which is hereby incorporated by reference.

This application claims priority from Korean Patent Application No. 10-20100113352, filed on Nov. 15, 2010, in the Korean Intellectual Property Office, and entitled: "Semiconductor Device," and all the benefits accruing therefrom under 35 U.S.C. 119, the contents of which is incorporated by reference herein in its entirety.

BACKGROUND

1. Field

Embodiments relate to a semiconductor device, and more particularly to a semiconductor device which can prevent and/or reduce damage to a substrate due to application of electrostatic discharge by adjusting a cross-sectional area of a bit line contact or a metal line according to a spaced-apart distance from a pad.

2. Description of the Related Art

In general, an electrostatic discharge (ESD) of a semiconductor device is one of factors affecting the reliability thereof. Accordingly, there is a need for a structure capable of protecting the semiconductor device from the ESD.

SUMMARY

One or more embodiments may provide a semiconductor device having improved reliability.

One or more embodiments provide a semiconductor device, including a substrate having an active region defined therein, a plurality of bit lines extending on the substrate in a first direction, a plurality of interconnection lines extending on the substrate in a second direction orthogonal to the first direction, a pad electrically connected to the plurality of interconnection lines and applying an external voltage, a plurality of metal contacts electrically connecting the interconnection lines and the plurality of bit lines, and a plurality of bit line contacts in contact with the active region and electrically connecting the plurality of bit lines and the active region, wherein as a distance between the pad and a respective bit line contact decreases, an area of the respective bit line contact contacting the active region increases.

With respect to an arbitrary first bit line among the plurality of bit lines, the plurality of bit line contacts may include first through nth bit line contacts electrically connecting the first bit line and the active region, the first through nth bit line contacts may be arranged sequentially to be spaced apart from the pad, and a first region of a kth bit line contact contacting the active region may be larger than a second region of the (k+1)th bit line contact contacting the active region, where n is a natural number greater than or equal to 2 and k is a natural number between 1 and n.

When electrostatic discharge is applied to the pad, a first branch current transferred to the kth bit line contact may be greater than a second branch current transferred to the (k+1)th bit line contact.

When electrostatic discharge is applied to the pad, a first branch current transferred to a unit area of the first region and a second branch current transferred to a unit area of the second region may be the same and/or substantially the same relative to each other.

With respect to an arbitrary first interconnection line among the plurality of interconnection lines, the plurality of interconnection lines may include first through mth metal contacts electrically connecting the first interconnection line and the plurality of bit lines, and the first through mth metal contacts may be sequentially arranged to be spaced apart from the pad, and when electrostatic discharge is applied to the pad, a first branch current transferred to the first metal contact may be greater than a second branch current transferred to the (l+1)th metal contact, where m is a natural number greater than or equal to 2 and l is a natural number between 1 and m.

The first through mth metal contacts may have a same and/or substantially same sectional area.

When electrostatic discharge is applied to the pad, the first branch current transferred to the unit area of the first region and the second branch current transferred to the unit area of the second region may have a same and/or substantially same magnitude.

The metal contacts may have a same and/or substantially same sectional area.

The semiconductor device may include a plurality of gate electrodes on the active region, a first impurity region in the active region of one side of the gate electrodes, and a second impurity region in the active region of another side of the gate electrodes, wherein the active region includes a first region close to the pad and a second region other than the first region, and among the first and second impurity regions in the first region, the plurality of bit line contacts are only in the first impurity region.

The first impurity region may be a drain region, and the second impurity region may be a source region.

The plurality of gate electrodes may be arranged in the first region at a first pitch and may be arranged in the second region at a second pitch, the first pitch may be greater than the second pitch.

One or more embodiments may provide a semiconductor device, including a substrate having an active region defined therein, a plurality of bit lines extending on the substrate in a first direction, a plurality of interconnection lines extending on the substrate in a second direction orthogonal to the first direction, a pad electrically connected to the plurality of interconnection lines and configured to apply an external voltage, a plurality of metal contacts electrically connecting the interconnection lines and the plurality of bit lines, and a plurality of bit line contacts in contact with the active region and electrically connecting the plurality of bit lines and the active region, wherein as a distance between the pad and a respective metal contact increases, a sectional area of the respective metal contact increases.

With respect to an arbitrary first interconnection line among the plurality of interconnection lines, the plurality of interconnection line contacts may include first through mth metal contacts electrically connecting the first interconnection line and the plurality of bit lines, the first through mth metal contacts may be arranged sequentially to be spaced apart from the pad, and a first sectional area of a first metal contact is larger than a second sectional area of the (l+1)th metal contact, where m is a natural number greater than or equal to 2 and l is a natural number between 1 and m.

When electrostatic discharge is applied to the pad, a first branch current transferred to the first meal contact and a second branch current transferred to the (l+1)th metal contact may have a same and/or substantially same magnitude.

When electrostatic discharge is applied to the pad, a magnitude of branch current transferred to the substrate through each of the plurality of bit line contacts may be same and/or substantially same.

With respect to an arbitrary first bit line among the plurality of bit lines, the plurality of bit line contacts may include first through nth bit line contacts electrically connecting the first bit line and the active region, the first through nth bit line contacts are arranged sequentially to be spaced apart from the pad, and when electrostatic discharge is applied to the pad, a first branch current transferred to the kth bit line contact and a second branch current transferred to the (k+1)th bit line contact are same and/or substantially same in magnitude, where n is greater than or equal to 2 and k is a natural number between 1 and n.

The first through nth bit line contacts may have a same and/or substantially same sectional area.

When electrostatic discharge is applied to the pad, a magnitude of branch current transferred to the substrate through the each of the bit line contacts may be same and/or substantially same.

The plurality of bit line contacts may have a same and/or substantially same sectional area.

One or more embodiments may provide a semiconductor device, including a substrate having an active region defined therein, a plurality of bit lines extending on the substrate in a first direction, a plurality of interconnection lines extending on the substrate in a second direction orthogonal to the first direction, a pad electrically connected to the plurality of interconnection lines and configured to apply an external voltage, a plurality of metal contacts electrically connecting the interconnection lines and the plurality of bit lines, and a plurality of bit line contacts that are in contact with the active region and electrically connect the plurality of bit lines and the active region, wherein a size of at least some of the bit line contacts and/or at least some of the metal contacts progressively vary based on a distance of the respective bit line contact or the metal contact from the pad.

BRIEF DESCRIPTION OF THE DRAWINGS

The above and other features will become more apparent to those of ordinary skill in the art by describing in detail exemplary embodiments with reference to the attached drawings, in which.

DETAILED DESCRIPTION

Figure 1:
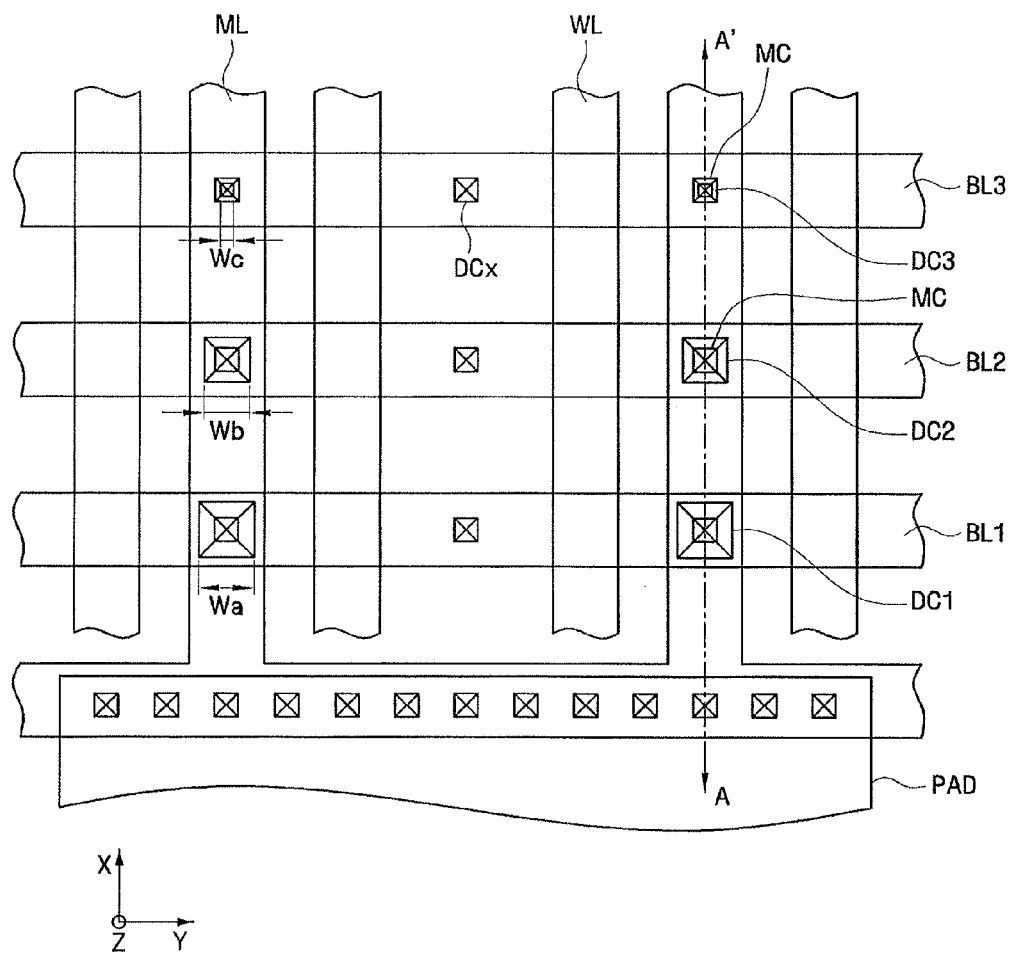
FIG. 1 illustrates a layout diagram of a portion of an exemplary embodiment of a semiconductor device.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when an element is referred to as being "on" another element, it can be directly on the other element, or intervening element may also be present. Further, it will also be understood that when an element is referred to as being "between" two elements, it can be the only element between the two elements, or one or more intervening elements may also be present. As used herein, the term "and/or" includes any and all combinations of one or more of the associated listed items. Like reference numerals refer to like elements throughout the specification.

Figure 2:
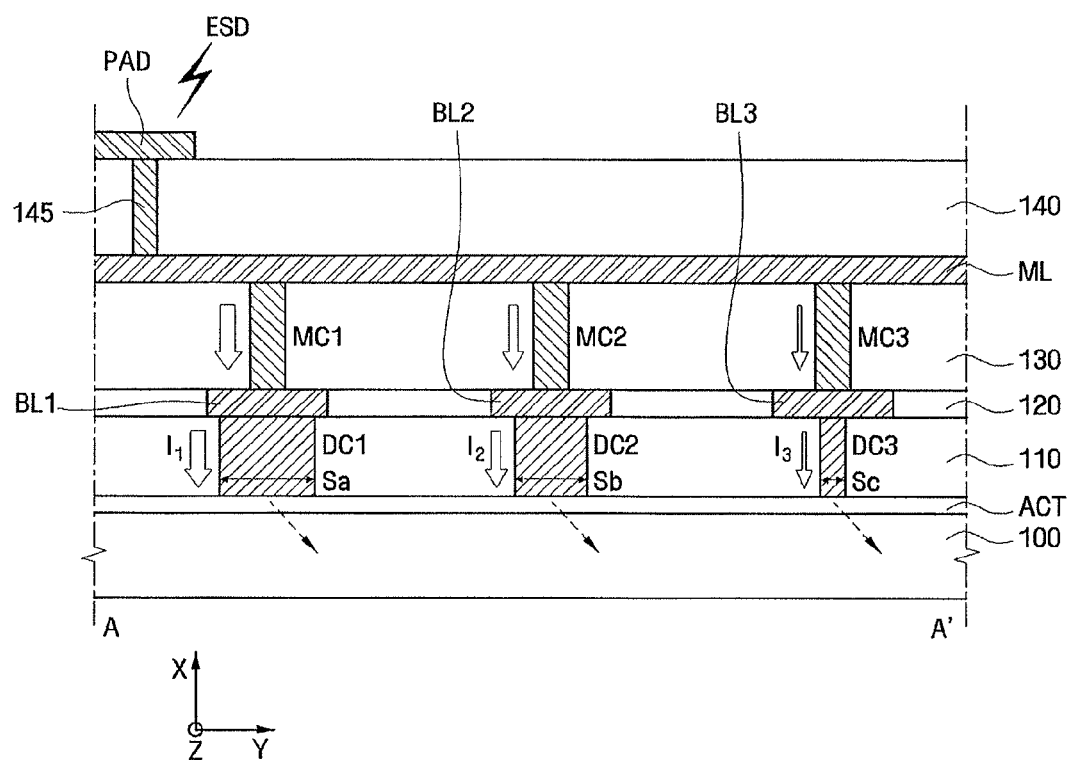
FIG. 2 illustrates a cross-sectional view of the semiconductor device of FIG. 1, taken along the line A-A' of FIG. 1.

Hereinafter, an exemplary embodiment of a semiconductor device will be described with reference to FIGS. 1 and 2. FIG. 1 illustrates a layout diagram of a portion of an exemplary embodiment of a semiconductor device. FIG. 2 illustrates a cross-sectional view of the semiconductor device of FIG. 1, taken along the line A-A' of FIG. 1.

Referring to FIGS. 1 and 2, the semiconductor device according to the illustrated embodiment may include a substrate 100, a plurality of bit lines BL, a plurality of word line WL, a plurality of interconnection lines ML, a pad PAD, a plurality of metal contacts MC, and a plurality of bit line contacts DC1, DC2, DC3. The semiconductor device may further include a first interlayer dielectric film 110, a second interlayer dielectric film 120, a third interlayer dielectric film 130, a fourth interlayer dielectric film 140, and a pad contact 145.

The substrate 100 may have an active region ACT defined by an isolation region (not shown). The isolation region may be formed using a field oxide (FOX) formed by a shallow trench isolation (STI) or a LOCal Oxidation of Silicon (LOCOS) process, but is not limited thereto. N- or P-type impurity may be implanted into the active region ACT.

The plurality of word lines WL may be arranged on the substrate 100. The plurality of bit lines BL may be arranged to cross the plurality of word lines WL. Memory cell transistors may be defined at respective regions where the bit lines BL and the word lines WL cross each other. The plurality of interconnection lines ML may also be arranged on the substrate 100. The word lines WL may extend parallel to each other along a first direction, e.g., x-direction. The bit lines BL may extend parallel to each other along a second direction, e.g., y-direction. The first direction x may be perpendicular to the second direction y. The interconnection lines ML may extend parallel to the word lines, e.g., along the first or x-direction.

The pad PAD may be electrically connected to the plurality of interconnection lines ML. The pad PAD may be employed to apply an external voltage. The plurality of metal contacts MC may electrically connect the corresponding ones of the interconnection lines ML and the plurality of bit lines BL. The pad contact 145 may be electrically connected to the pad PAD.

The plurality of bit line contacts DC1, DC2, DC3 may be in contact with the active region ACT. The plurality of bit line contacts DC1, DC2 . . . DCn may be arranged to be sequentially spaced apart from the pad PAD. The plurality of bit line contacts DC may electrically connect corresponding ones of the plurality of bit lines BL and the active region ACT. In one or more embodiments, the smaller the distance between the pad PAD and each of the bit line contacts DC1, DC2, DC3, the larger the contact area between each of the plurality of bit line contacts DC1, DC2, DC3 and the active region ACT. That is, the closer the bit line contact DC is to the pad PAD, the respective area of the respective bit line contact DC may be larger. More particularly, referring to FIG. 1, the bit line contacts DC1, DC2, DC3 may have different widths Wa, Wb, Wc.

Further, in one or more embodiments, e.g., in the exemplary embodiment of FIGS. 1 and 2, the respective areas of at least some, if not all, of the bit line contacts DC may be progressively smaller proportional by, e.g., a constant amount, step-wise manner, etc., to a distance of the respective bit line contact DC from the pad PAD.

Referring to FIGS. 1 and 2, the first interlayer dielectric film 110 may be formed on the substrate 100 having the active region ACT defined therein. The first interlayer dielectric film 110 may be formed such that bit line contacts DC1, DC2, DC3 are in contact with the active region ACT. The widths W of at least some of the bit line contacts DC may differ, e.g., increase or decrease, across the first interlayer dielectric film 110 the further the respective bit line contact is from the pad PAD. More particularly, e.g., the widths Wa, Wb, Wc of the bit line contacts DC1, DC2, DC3 may be such that Wa>Wb>Wc. In one or more embodiments, e.g., all of the bit line contacts DC corresponding to respective ones of the bit lines BL may have a same width and/or area. That is, e.g., all of the bit line contacts DC1 associated with the first bit line $BL_1$ closest to the pad PAD may have the first width Wa, all of the bit line contacts DC2 associated with the second bit line $BL_2$ may have the second width Wb, and all the bit line contacts DC3 associated with the third bit line $BL_3$ may have the third width Wc and Wa>Wb>Wc. In the exemplary embodiment illustrated in FIGS. 1 and 2, the bit line contacts DC1, DC2, DC3 associated with respective ones of the bit lines BL1, BL2, BL3 are sequentially smaller such that Wa>Wb>Wc.

For example, in one or more embodiments, beyond a predetermined number of the bit lines BL and/or a predetermined distance from the pad PAD, e.g., the width W of the bit line contacts DC may remain constant and may not get smaller. More particularly, e.g., in one or more embodiments including n bit lines BL1 to BLn, where n is any integer, the bit line contacts DC1 to DCx of a predetermined number x of the bit lines BLn, where x is less than, n may have sequentially smaller widths as the distance to the pad PAD increases, and the bit line contacts DCx+1 to DCn of the remaining bit lines BLx to BLn may have same widths.

Referring to FIGS. 1 and 2, contact areas of the first bit line contacts DC1 may be larger than contact areas of the second bit line contacts DC2, and the contact areas of the second bit line contacts DC2 may be larger than contact areas of the third bit line contacts DC3.

More particularly, as shown in FIG. 1, the closer to the pad PAD is to the bit line contacts DC1, DC2, DC3, the width Wa, Wb, Wc of the corresponding bit line contacts DC1, DC2, DC3 may be greater. Respective contact areas between the bit line contacts DC1, DC2, DC3 and the active region ACT may increase in proportion to the widths Wa, Wb, Wc of the bit line contacts DC1, DC2, DC3.

Further, referring to FIG. 2, cross-sectional areas along the first direction x and a third direction z, e.g., cross-sectional areas along x-z planes, of the bit line contacts DC1, DC2, DC3 may increase in proportion to the widths Wa, Wb, Wc of the bit line contacts DC1, DC2, DC3.

In one or more embodiments, bit line contacts DCx that are not electrically connected to the interconnection lines ML may have sizes that are not based on a distance between the bit line contacts DCx and the pad PAD, e.g., may be a predetermined size irrespective of the distance between the bit line contacts DCx and the pad PAD. For example, all of the bit line contacts DCx that are not electrically connected to the interconnection lines ML may have a same width Wx and/or area.

In one or more embodiments, a contact area Sa between the a-th bit line contact DC and the corresponding active region ACT, i.e., a first contact region, and a contact area Sb between the b-th bit line contact and the corresponding active region ACT, i.e., a second contact region, may be such that the first contact area may be larger than the second contact area Sa>Sb, where a<b, and where a and b are natural numbers greater than or equal to 1. More particularly, as shown in FIG. 2, e.g., in embodiments in which the first bit line contact DC1 is arranged closer to the pad PAD than the second bit line contact DC2, the contact area Sa between the first bit line contact DC1 and the corresponding active region ACT may be larger than the contact area Sb between the second bit line contact DC2 and the corresponding active region ACT.

When electrostatic discharge (ESD) is applied through the pad PAD, the ESD may be transferred to the plurality of bit line contacts DC1, DC2, DC3 through the pad contact 145, the interconnection lines ML, metal contacts MC, and the bit lines BL.

In one or more embodiments, by providing bit line contacts DC having relatively larger widths closer to the pads, relatively larger amounts of branch current may flow in the relatively-larger-width bit line contacts DC closer to the pads PAD. More particularly, the relatively-larger-width bit line contacts DC have a relatively smaller resistance, and thus, relatively larger amounts of branch current may flow therein. Therefore, relatively larger amounts of branch current may flow in the relatively-larger-width bit line contacts arranged closer to the pad PAD.

In more detail, as shown in FIG. 2, when ESD is applied to the pad PAD, a first branch current I1 transferred to one of the bit line contacts DC having a relatively larger width and arranged closer to the pads PAD, e.g., DC1, may be greater than a second branch current I2 transferred to the another one of the bit line contacts DC having a relatively smaller width and arranged relatively further from the pads PAD, e.g., DC2. Further, e.g., the second branch current I2 transferred to the second bit line contact DC2 may be greater than a third branch current I3 transferred to the third bit line contact DC3. In the drawing, magnitudes of the respective branch currents are differently indicated using sizes and thickness of arrows.

As described above, in one or more embodiments, the closer to the pad PAD the plurality of bit line contacts DC1, DC2, DC3 are arranged, the larger the contact areas between the respective bit line contacts DC1, DC2, DC3 and the active region ACT may be. Accordingly, even if a relatively large amount of branch current is transferred to the bit line contact closer to the pad PAD, amounts of branch current transferred to the substrate 100 through unit areas may be the same and may be negligible so as not to affect the substrate 100.

For example, referring to FIGS. 1 and 2, when ESD is applied through the pad PAD, with the first region Sa of the first bit line contact DC1 contacting the active region ACT being larger than the second region Sb of the second bit line contact DC2 contacting the active region ACT, even if the branch current transferred to the first bit line contact DC1 is greater than the branch current transferred to the second bit line contact DC2, the effect of the branch current of the ESD applied to the substrate 100 may be the same or similar and/or negligible.

Likewise, referring to the exemplary embodiment of FIG. 2, since the second region Sb of the second bit line contact DC2 contacting the active region ACT is greater than a third region Sc of the third bit line contact DC3 contacting the active region ACT, amounts of branch current transferred to unit areas of the second region Sb and the third region Sc may be substantially similar to each other. Further, the branch current transferred to the respective regions Sa, Sb, Sc may escape through the substrate 100, as indicated by a dotted line of FIG. 2, and the amounts of branch current transferred to the respective regions Sa, Sb, Sc may be negligible and may not adversely affect the substrate 100.

Referring to FIG. 2, the second interlayer dielectric film 120 may be formed on the first interlayer dielectric film 110. The plurality of bit lines BL may be formed in the second interlayer dielectric film 120. Further, the third interlayer dielectric film 130 may be formed on the second interlayer dielectric film 120. The plurality of metal contacts MC electrically connecting the bit lines BL and the interconnection lines ML may be formed across the third interlayer dielectric film 130. In one or more embodiments, the plurality of metal contacts MC may have the same width, e.g., magnitude, and/or sectional areas irrespective of the distance of the respective metal contact MC to the pad. Alternatively, e.g., in one or more embodiments, widths and/or sectional areas of the metal contacts MC may vary, e.g., be larger, the further the metal contact is to the pad PAD.

In other words, one, some or all of the interconnection lines may each be coupled to respective ones of the plurality of metal contacts MC electrically connecting the respective interconnection line and the plurality of bit lines BL, e.g., BL1, BL2, and BL3. The first through m-th metal line contacts MC coupled to each of the interconnection lines may be arranged sequentially so as to be sequentially spaced apart from the pad PAD.

Further, in one or more embodiments, when ESD is applied to the pad PAD, the first branch current I1 transferred to the first metal contact MC1 arranged closer to the pad PAD may be greater than the second branch current I2 transferred to the second metal contact MC2 arranged relatively further from the pad PAD. More particularly, e.g., by providing the respective bit line contacts DC closer to the pad PAD with relatively larger widths W and/or sectional areas S, the ESD effect may be reduced and/or eliminated.

As described above, in one or more embodiments, the plurality of metal contacts MC may have a same size and/or may have a same sectional area. However, embodiments are not limited thereto. For example, the plurality of metal contacts MC may have different sizes. However, in one or more embodiments, the plurality of bit line contacts DC1, DC2, DC3, sizing of the plurality of metal contacts MC may not be related to a distance of the metal contact MC from the pad PAD. In other words, in one or more embodiments, sizing, e.g., width and/or sectional area, of the plurality of bit line contacts DC1, DC2, DC3 may be based on a distance of the respective bit line contact DC1, DC2, DC3 to the pad PAD, however, sizing, e.g., width and/or sectional area, of the plurality of metal contacts MC may be determined irrespective of the distance of the metal contact MC from the pad PAD.

Referring to FIG. 2, the fourth interlayer dielectric film 140 may be formed on a third interlayer dielectric film 130 having the interconnection lines ML formed thereon. The pad contact 145 electrically connecting the pad PAD and the interconnection lines ML may be formed in the fourth interlayer dielectric film 140. The pad PAD may be formed at one side of the active region ACT.

In one or more embodiments, when an external voltage is applied to the pad PAD, the external voltage may be transferred to the interconnection lines ML through the pad contact 145 electrically connected to the pad PAD, to the bit lines BL through the metal contacts MC electrically connected to the interconnection lines ML, and to the active region ACT of the substrate 100 through the bit line contacts DC electrically connected to the bit lines BL.

Likewise, when ESD is applied to the pad PAD, branch current corresponding to the ESD may be transferred to the substrate 100 through the pad contact 145, the interconnection lines ML, the metal contacts MC, the bit lines BL and the bit line contacts DC.

In one or more embodiments, by varying the widths and/or sectional areas of the bit line contacts DC, the branch current of ESD transferred to the respective metal contacts MC may be uniformly transferred to the bit line contact DC irrespective of the distance from the pad PAD. More particularly, in one or more embodiments of a semiconductor device, by providing bit line contacts having larger sectional areas and/or widths closer to the pad PAD, the resistance of the bit line contacts closer to the pad PAD may be respectively reduced, and the same and/or substantially same amount of branch current of ESD can be transferred to the bit line contacts DC irrespective of the distance between the pad and each of the bit line contact.

Figure 3:
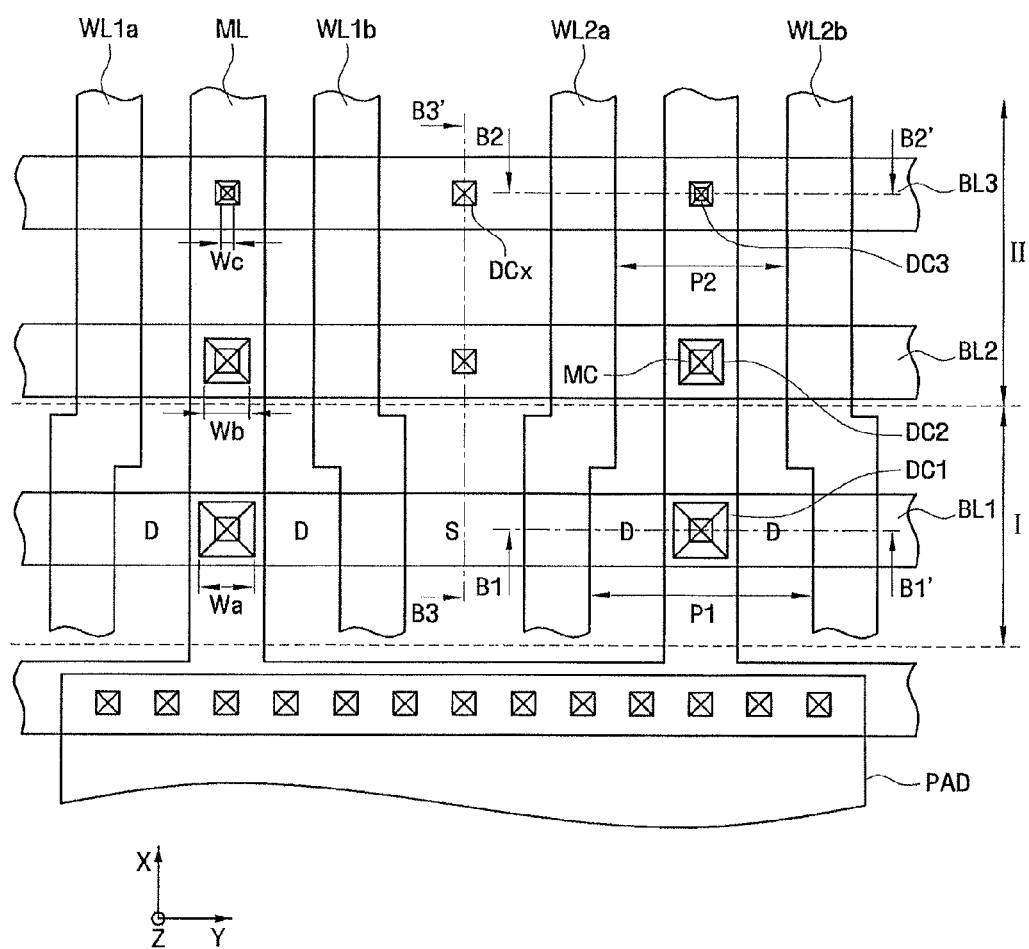
FIG. 3 illustrates a layout diagram of a portion of another exemplary embodiment of a semiconductor device.
Figure 4:
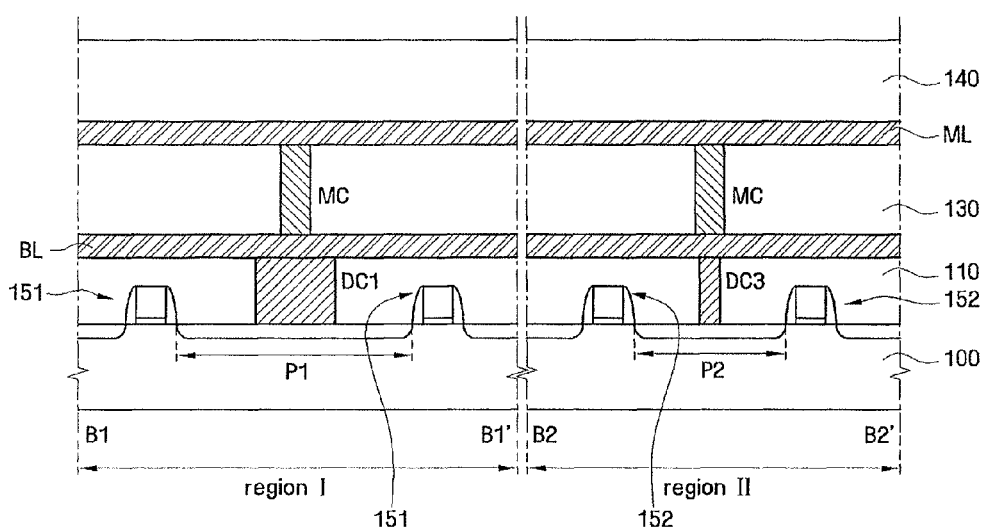
FIG. 4 illustrates a cross-sectional view of the semiconductor device of FIG. 3, taken along the lines B1-B1' and B2-B2' of FIG. 3.
Figure 5:
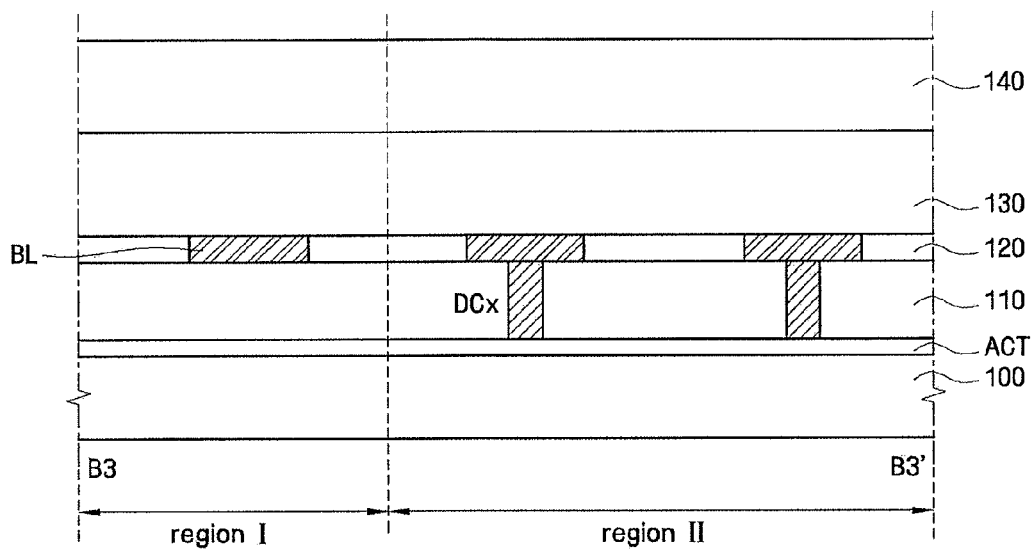
FIG. 5 illustrates a cross-sectional view of the semiconductor device of FIG. 3, taken along the line B3-B3' of FIG. 3.

FIG. 3 illustrates a layout diagram of a portion of another exemplary embodiment of a semiconductor device. FIG. 4 illustrates a cross-sectional view of the semiconductor device of FIG. 3, taken along the lines B1-B1' and B2-B2' of FIG. 3. FIG. 5 illustrates a cross-sectional view of the semiconductor device of FIG. 3, taken along the line B3-B3' of FIG. 3.

In general, only differences between the exemplary embodiment of FIGS. 1 and 2 and the exemplary embodiment of FIGS. 3-5 will be described below. That is, a detailed description of substantially the same functional components as those of the previous embodiment may not be repeated. In the exemplary embodiment of the semiconductor device illustrated in FIGS. 3-5, pitches of a gate electrode are varied according as a bit line contact increases in size.

Referring first to FIGS. 3 and 4, the semiconductor device according to the illustrated embodiment includes the substrate 100, a plurality of gate electrodes 151, 152, a first impurity region, a second impurity region, the plurality of bit lines BL, and the plurality of word lines WL.

The active region ACT may be defined in the substrate 100, and the plurality of gate electrodes 151, 152 may be formed on the active region ACT. The plurality of gate electrodes 151, 152 may be arranged to cross the bit lines BL. The gate electrodes 151, 152 may be insulated from the substrate 100 by a gate insulation film. Sidewall spacers may be formed at opposite sidewalls of the gate electrodes 151, 152.

The first impurity region may be formed in the active region ACT on one side of the gate electrodes 151, 152, and a second impurity region may be formed in the active region ACT of the other side of the gate electrodes 151, 152. The first and second impurity regions may be formed by implanting impurity ions into the substrate 100 through an ion implantation process. Here, the first impurity region may be a drain region, and the second impurity region may be a source region.

Referring to FIG. 3, the substrate 100 having the active region ACT defined therein may include a first region I arranged close to a pad PAD, and a second region II, e.g., region other than the first region I. The plurality of bit line contacts DC1 arranged in the first region I may have larger widths and sectional areas than a plurality of bit line contact DC2, DC3 arranged in the second region II. More particularly, the plurality of bit line contacts DC1 arranged in the first region I may be formed in contact with the active region ACT of the substrate 100 with a larger contact area than the plurality of bit line contact DC2, DC3 arranged in the second region II.

FIGS. 3 and 4 illustrate that widths Wa, Wb, Wc of the plurality of bit line contacts DC1, DC2, DC3 may be increased as the plurality of bit line contacts DC1, DC2, DC3 get closer to the pad PAD. The widths Wa, Wb, Wc of the bit line contacts DC1, DC2, DC3 may be respectively increased in same or differing increments. Further, in one or more embodiments, the bit line contacts arranged in the first region I may have a first constant width, that is, a first magnitude, and the bit line contacts arranged in the second region II may have a second constant width, that is, a second magnitude, where the first magnitude may be greater than the second magnitude.

Further, as shown in FIG. 3, a first gate line WLa and a second gate line WLb may extend in the first direction, e.g., x-direction. The first gate line WLa and the second gate line WLb may be arranged in the first region I at a first pitch P1, and arranged in the second region II at a second pitch P2. Here, the first pitch P1 may be greater than the second pitch P2. Accordingly, the closer to the pad PAD, the greater the plurality of bit line contacts DC1, DC2, DC3 have magnitudes, sectional areas and contact areas with the substrate 100, thereby preventing the plurality of bit line contacts DC1, DC2, DC3 from contacting the gate electrodes 151 and 152.

As shown in FIG. 4, a first pitch P1 between neighboring gate electrodes 151 in the first region I may be greater than a second pitch P2 between neighboring gate electrodes 152 in the second region II. The plurality of bit line contacts DC1, DC2, DC3 may be respectively formed between corresponding ones of the gate electrodes 151, 152 spaced apart from each other at the first pitch P1 or the second pitch P2. In other words, distances between the neighboring gate electrodes 151, 152 may be varied, e.g., increased, according to the widths W, e.g., magnitudes, of the respective bit line contacts DC1, DC2, DC3 arranged therebetween.

In the exemplary embodiment of FIG. 3-5, the first region I has the gate electrodes 151 regularly arranged at the first pitch P1, and the second region II has the gate electrodes 152 regularly arranged at the second pitch P2. However, pitches of the gate electrodes 151 in the first region I and/or pitches of the gate electrodes 152 in the second region may be varied, e.g., stepwise or by a constant distance. For example, neighboring ones of the gate electrodes 151 that are closer to the pad PAD may be formed obliquely so as to increase the distance between each other in order to accommodate for the relatively larger width of the bit line contact DC arranged therebetween.

More particularly, in the exemplary embodiment of FIGS. 3-5, each of the pairs of gate lines WL1a and WL1b, WL2a and WL2b may define the first pitch P1 in the first region I and the second pitch P2 in the second region. The first pitch P1 may be defined by respective portions of the pair of the gate lines WL1a and WL1b, WL2a and WL2b arranged closer to the pad PAD. Further, the pairs of the gate lines WL1a and WL1b, WL2a and WL2b may be arranged about a first impurity region, for example, a drain region D. In other words, bit line contacts DC1, DC2, DC3 electrically connected to the interconnection lines ML may be arranged to be in contact with the respective drain region D. In addition, a distance between two corresponding ones of the gate electrodes, e.g., the gate electrodes 151 arranged at opposite sides about the bit line contacts DC, e.g., DC1, in the first region I closer to the pad may be greater than a distance between corresponding ones of the gate electrodes 152 arranged at opposite sides of the bit line contacts, e.g., DC2, DC3, in the second region II.

In contrast, a pair of word lines WL1b and WL2a arranged about the second impurity region, for example, a source region S, may be closer to each other as they get closer to the pad PAD. In addition, as shown in FIG. 5, as the pitches of the gate electrodes 151, 152 are varied, specifically as the pitch between the pair of gate electrodes WL1a and WL1b arranged about the drain region D is increased while the pitch between the pair of gate electrodes WL1a and WL2b arranged about the source region S is decreased, bit line contacts DCx may not be formed on the source region.

In other words, in one or more embodiments, the plurality of gate electrodes 151, 152 formed on the substrate 100 may be formed such that the pitch between the pair of gate electrodes WLa and WLb arranged about the source region S is decreased as the pitch P1, P2 between the pair of gate electrodes WLa and WLb arranged about the drain region is increased. Further, with respect to the first region I close to the pad PAD, bit line contacts, e.g., DC1, may not be formed in a first impurity region defined in the active region of one side of the gate electrodes 151, e.g., a source region S. Accordingly, short circuits between the bit line contacts, e.g., DC1, and the gate electrodes 151 may be advantageously prevented.

Figure 6:
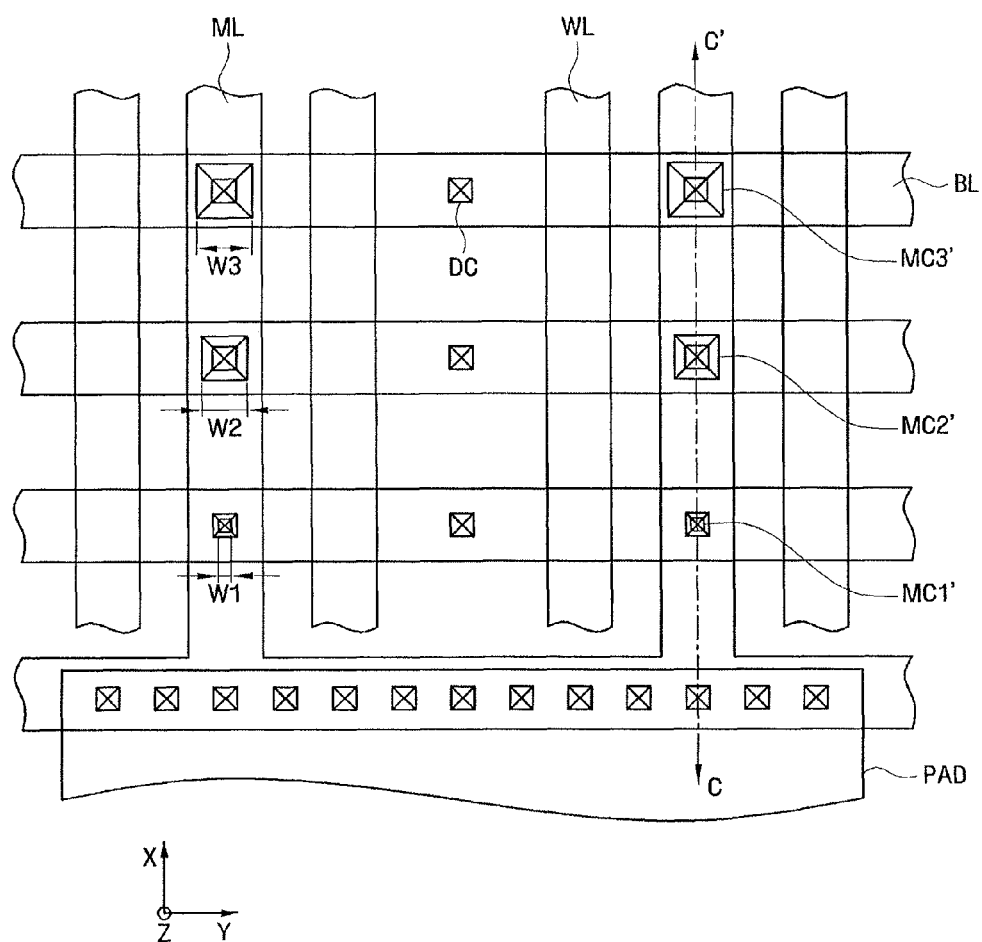
FIG. 6 illustrates a layout diagram of a portion of another exemplary embodiment of a semiconductor device.
Figure 7:
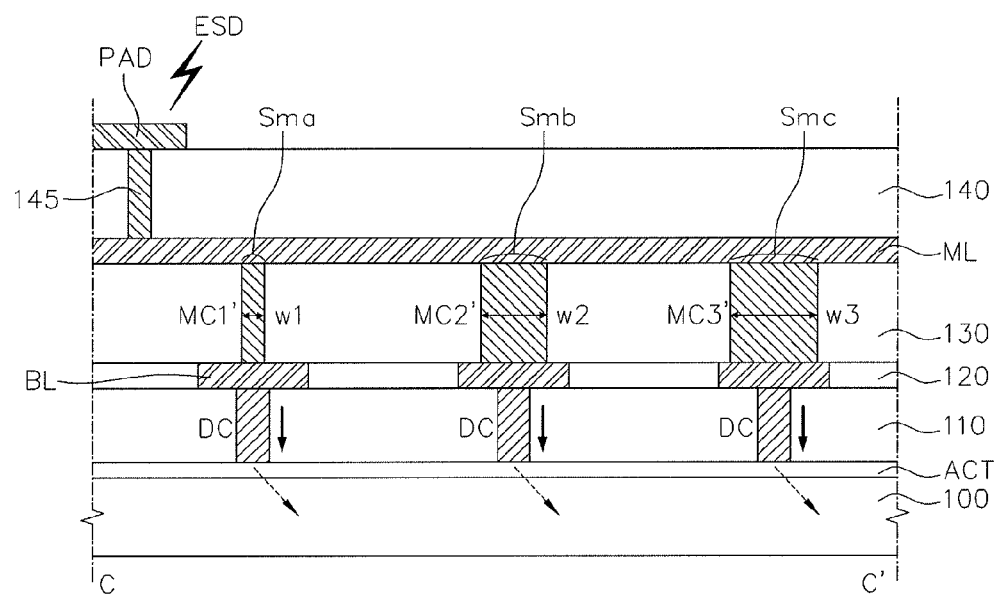
FIG. 7 illustrates a cross-sectional view of the semiconductor device of FIG. 6, taken along the lines C-C' of FIG. 6.

FIG. 6 illustrates a layout diagram of a portion of another exemplary embodiment of a semiconductor device. FIG. 7 illustrates a cross-sectional view of the semiconductor device of FIG. 6, taken along the lines C-C' of FIG. 6.

In general, only differences between the exemplary embodiment of FIGS. 1 and 2 and the exemplary embodiment of FIGS. 6 and 7 will be described below. That is, a detailed description of substantially the same functional components as those of the previous embodiment may not be repeated.

Referring to FIGS. 6 and 7, a semiconductor device may include the plurality of bit line contacts DC and a plurality of metal contacts MC'. In the exemplary embodiment of FIGS. 6 and 7, the greater the distance between the pad PAD and each of the metal contacts MC', the larger the sectional area of each of the metal contacts MC'.

As shown in FIGS. 6 and 7, the semiconductor device according to the illustrated embodiment may include the substrate 100, the plurality of bit lines WL, the plurality of interconnection lines ML, the plurality of bit lines BL, the pad PAD, the plurality of bit line contacts DC, and the plurality of metal contacts MC'.

The plurality of metal contacts MC1', MC2', MC3' may electrically connect the interconnection lines ML and the plurality of bit lines BL. The plurality of bit line contacts DC may electrically connect the plurality of bit lines BL and the active region ACT. In the exemplary embodiment of FIGS. 6 and 7, the greater the distance between the pad PAD and each of the metal contacts MC1', MC2', MC3', the larger the sectional areas of the plurality of metal contacts MC1', MC2', MC3'.

In more detail, as shown in FIG. 6, the first interlayer dielectric film 110 may be formed on the substrate 100 having the active region ACT defined therein, and the bit line contacts DC may be formed to be in contact with the active region ACT across the first interlayer dielectric film 110. As shown in FIG. 6, the farther from the pad PAD the metal contacts MC1', MC2', MC3' are arranged, the greater the widths of W1, W2, W3 of the metal contacts MC1', MC2', MC3'. The widths of W1, W2, W3 of the metal contacts MC1', MC2', MC3' may be increased in inverse proportion to the distance between the metal contacts MC1', MC2', MC3' and the pad PAD. From another point of view, sectional areas of the metal contacts MC1', MC2', MC3' may be increased in proportion to the widths W1, W2 and W3 of the metal contacts MC1', MC2', MC3'.

In other words, with respect to an arbitrary first interconnection line ML among the plurality of interconnection lines ML, the plurality of metal contacts MC' may include first through mth metal contacts MC1', MC2' . . . MCm' electrically connecting the respective ones of the plurality of interconnection lines ML and the plurality of bit lines BL. In one or more embodiments, the first through m-th metal contacts MC1', MC2', . . . , MCm' may be arranged to be sequentially spaced apart from the pad PAD. For example, the first metal contact MC1' may be arranged closer to the pad PAD than the second metal line contact MC2'.

In one or more embodiments, a contact area Sma of the a-th metal contact MCa' and the interconnection line ML is a first region, i.e., a first contact region, and a contact area Smb of the second metal contact MCb' is a second region, i.e., a second contact region, may be such that the first contact area Sma is less than the second contract area Smb, i.e., Sma<Smb, where a<b and where a and b are natural numbers greater than or equal to 1. More particularly, as shown in FIG. 7, the first metal contact MC1' arranged closer to the pad PAD than the second metal contact MC2' may have the width W1 smaller than the width W2 of the second metal contact MC2'. Further, e.g., a first sectional area of the first metal contact MC1' along the first and third directions, e.g., z-x planes, may be smaller than a second sectional area of the second metal contact MC2' along the z-x planes.

When electrostatic discharge (ESD) is applied through the pad PAD, the ESD may be transferred to the plurality of bit line contacts DC1, DC2, DC3 through the pad contact 145, the interconnection lines ML, metal contacts MC', and the bit lines BL. As described above, since the metal contacts MC' close to the pad PAD may have relatively smaller width, resistance of the metal contacts MC' that is relatively close to the pad PAD may be relatively large. More particularly, the first metal contact MC1' closest to the pad may have the smallest width W1, and thus, may have the relatively largest resistance as compared to the to other metal contacts MC2' . . . MCn, which may have relatively larger widths W2 . . . Wm.

Therefore, in one or more embodiments, by providing metal contacts MC' having relatively larger resistances the closer the metal contact MC' is to the pad, the resistance of the metal contacts MC' closer to the pad PAD are relatively and respectively larger. Thus, when ESD is applied to the pad PAD, magnitudes of branch current of the ESD transferred to the respective metal contacts MC1', MC2', MC3' may be substantially the same with each other. In other words, a first branch current of ESD transferred to the a-th metal contact and a second branch current of ESD transferred to the b-th metal contact may be substantially the same in view of magnitude.

In more detail, as shown in FIG. 7, when ESD is applied to the pad PAD, a first branch current transferred to the a-th bit line contact DC1, DC2, DC3 close to the PAD, for example, a first metal contact MC1, may be substantially the same with a second branch current transferred to the bth metal contact, for example, a second metal contact MC2. Likewise, the second branch current transferred to the second metal contact MC2 may be substantially the same with a third branch current transferred to a third metal contact MC3. In the drawing, magnitudes of the respective branch currents are identically indicated using sizes and thickness of arrows.

As described above, in the exemplary embodiment of FIGS. 6 and 7, the closer to the pad PAD the plurality of metal contacts MC1', MC2', MC3' are arranged, the smaller the widths, that is, sectional areas, of the respective metal contacts MC1', MC2', MC3'. Accordingly, the same amount of branch current may be transferred to the respective metal contacts MC' irrespective of the distance from the pad PAD. Therefore, amounts of branch current transferred to the substrate 100 through the respective metal contacts MC1, MC2 and MC3 and the bit line contacts DC may be the same and may be negligible so as not to adversely affect the substrate 100.

Further, in one or more embodiments, e.g., in the exemplary embodiment of FIGS. 6 and 7, the respective areas of at least some, if not all, of the metal contact MC may be progressively larger proportional by, e.g., a constant amount, step-wise manner, etc., to a distance of the respective metal contact MC from the pad PAD.

As shown, among the plurality of bit lines BL, an arbitrary first bit line is electrically connected to the active region ACT through first through nth bit line contacts DC, which are arranged sequentially to be spaced apart from the pad PAD.

Further, when ESD is applied to the pad PAD, a first branch current transferred to the first bit line contact close to the pad PAD may have substantially the same magnitude with that of a second branch current transferred to the second bit line contact.

This is because the branch current of ESD transferred to the respective metal contacts MC1', MC2', MC3' may be uniformly transferred to the bit line contact irrespective of the distance from the pad PAD due to variations in sectional areas or widths of the metal contacts MC1', MC2', MC3'.

In one or more embodiments, sectional areas and/or widths of respective bit line contacts and/or metal contacts may be varied based on a distance of the bit line contact and/or metal line contact from the pad. For example, the widths of the metal contacts may be made larger as the metal contact is arranged farther from the pad, thereby reducing the resistance of the metal contact. Accordingly, the same amount of branch current of ESD can be transferred to the metal contact irrespective of the distance between the pad and each of the metal contacts.

Accordingly, the same magnitude of branch current of ESD can be transferred to the bit line contact in contact with the substrate, and magnitudes of the metal contact close to the pad PAD and the bit line contact can be reduced. Therefore, it is possible to minimize the substrate damaged due to the branch current of ESD. Thus, the reliability of the semiconductor device can be improved.

The terminology used herein is for the purpose of describing particular embodiments only and is not intended to be limiting. As used herein, the singular forms "a", "an" and "the" are intended to include the plural forms as well, unless the context clearly indicates otherwise.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings herein.

Embodiments described herein are described referring to plan views and/or cross-sectional views by way of ideal schematic views. Accordingly, the exemplary views may be modified depending on manufacturing technologies and/or tolerances. Therefore, the embodiments are not limited to those shown in the views, but include modifications in configuration formed on the basis of manufacturing processes. Therefore, regions exemplified in figures have schematic properties and shapes of regions shown in figures exemplify specific shapes of regions of elements and not limit aspects of the embodiments.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   a substrate having an active region defined therein;
   a plurality of bit lines extending on the substrate in a first direction;
   a plurality of interconnection lines extending on the substrate in a second direction orthogonal to the first direction;
   a pad electrically connected to the plurality of interconnection lines and configured to apply an external voltage;
   a plurality of metal contacts electrically connecting the interconnection lines and the plurality of bit lines; and
   a plurality of bit line contacts in contact with the active region and electrically connecting the plurality of bit lines and the active region,
   wherein a sectional area of one metal contact is larger than a sectional area of another metal contact when a distance between the one metal contact and the pad is greater than a distance between the another metal contact and the pad.

2. The semiconductor device as claimed in claim 1, wherein, with respect to an arbitrary first interconnection line among the plurality of interconnection lines, the plurality of interconnection line contacts include first through mth metal contacts electrically connecting the first interconnection line and the plurality of bit lines, the first through mth metal contacts are arranged sequentially to be spaced apart from the pad, and a first sectional area of a first metal contact is larger than a second sectional area of the (l+1)th metal contact, where m is a natural number greater than or equal to 2 and l is a natural number between 1 and m.

3. The semiconductor device as claimed in claim 2, wherein, when electrostatic discharge is applied to the pad, a first branch current transferred to the first metal contact and a second branch current transferred to the (l+1)th metal contact have a same and/or substantially same magnitude.

4. The semiconductor device as claimed in claim 2, wherein, when electrostatic discharge is applied to the pad, a magnitude of branch current transferred to the substrate through each of the plurality of bit line contacts is same and/or substantially same.

5. The semiconductor device as claimed in claim 1, wherein, with respect to an arbitrary first bit line among the plurality of bit lines, the plurality of bit line contacts include first through nth bit line contacts electrically connecting the first bit line and the active region, the first through nth bit line contacts are arranged sequentially to be spaced apart from the pad, and, when electrostatic discharge is applied to the pad, a first branch current transferred to the kth bit line contact and a second branch current transferred to the (k+1)th bit line contact are same and/or substantially same in magnitude, where n is greater than or equal to 2 and k is a natural number between 1 and n.

6. The semiconductor device as claimed in claim 5, wherein the first through nth bit line contacts have a same and/or substantially same sectional area.

7. The semiconductor device as claimed in claim 5, wherein, when electrostatic discharge is applied to the pad, a magnitude of branch current transferred to the substrate through the each of the bit line contacts is same and/or substantially same.

8. The semiconductor device as claimed in claim 1, wherein the plurality of bit line contacts have a same and/or substantially same sectional area.

* * * * *